US000001331H

United States Statutory Invention Registration [19]

[11] Reg. Number: H1331

Skudera, Jr. [43] Published: Jul. 5, 1994

[54] WIDE BANDWIDTH, HIGH RESOLUTION CIRCUITRY FOR PHASE SHIFTED FREQUENCY DETECTION

[75] Inventor: William J. Skudera, Jr., Oceanport, N.J.

[73] Assignee: The United States of America as represented by the Secretary of the Army, Washington, D.C.

[21] Appl. No.: 899,793

[22] Filed: Jun. 17, 1992

[51] Int. Cl.[5] ..... G01R 23/16

[52] U.S. Cl. ..... 324/76.23; 324/77.11; 324/76.33; 324/76.22

[56] References Cited

U.S. PATENT DOCUMENTS

| | | | |
|---|---|---|---|
| H292 | 6/1987 | Klose | 342/394 |
| 4,538,152 | 8/1985 | Wirth | 342/383 |
| 4,821,037 | 4/1989 | Miller | 342/383 |
| 4,870,420 | 9/1989 | Apostolos | 342/442 |
| 4,876,549 | 10/1989 | Masheff | 342/417 |
| 4,965,581 | 10/1990 | Skudera | 342/19 |
| 4,994,740 | 2/1991 | Skudera . | |

*Primary Examiner*—Bernarr E. Gregory

*Attorney, Agent, or Firm*—Michael Zelenka; John M. O'Meara

[57] ABSTRACT

Phase shifted frequency components of wide bandwidth, composite signals are focused for analysis with high resolution by circuitry which includes both a Chirp-Z and a superheterodyne signal analyzer. An interface between the analyzers synchronizes the outputs therefrom relative to each phase shifted frequency component. Preferred embodiments are disclosed with the analyzers generally arranged in either parallel or series and replicating circuitry may be included in the latter to sustain the integrity of the phase shifted frequency components for some predetermined period of time.

20 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

WIDE BANDWIDTH, HIGH RESOLUTION CIRCUITRY FOR PHASE SHIFTED FREQUENCY DETECTION

GOVERNMENT INTEREST

The invention described herein may be manufactured, used, and licensed by or for the government for governmental purposes without payment to me of any royalties thereon.

BACKGROUND OF THE INVENTION

The present invention relates generally to signal analysis and more particularly to analysis regardinq phase shifted frequency detection, such as in regard to doppler signals.

Electromagnetic signals such as those found in communications and radar applications, are a composite of many frequency components. In these applications, it is the individual frequency components which are analyzed. Signal analyzers of various types are very well known in the art. However, all such analyzers are of limited performance in that either wide bandwidth, low resolution analysis or narrow bandwidth, high resolution analysis is possible therewith. Usually the sweep rate of a local oscillator in the analyzer determines how the performance thereof will be limited, with rapid sweep rates resulting in wide bandwidth analysis and slow sweep rates resulting in high resolution analysis. High resolution analysis is even a greater problem when phase shifted frequency components are evaluated using those signal analyzers which are capable of detecting such components over a wide bandwidth.

The inventor of the invention disclosed and claimed herein, is a coinventor of the invention for which U.S. Pat. No. 4,994,740 was issued on Feb. 19, 1991. This patent discloses and claims arrangements of Chirp-Z analyzers which are capable of detecting frequency components over a wide bandwidth, with high resolution.

SUMMARY OF THE INVENTION

It is the general object of the present invention to detect phase shifted frequency components over a wide bandwidth with high resolution.

It is one specific object of the present invention to accomplish the above-stated general object with a substantially parallel combination of a wide bandwidth Chirp-Z signal analyzer and a narrow bandwidth superheterodyne signal analyzer.

It is another specific object of the present invention to accomplish the above-stated general object with a substantially series combination of a wide bandwidth Chirp-Z signal analyzer and a narrow bandwidth superheterodyne signal or spectrum analyzer, with high resolution.

These and other objects are accomplished in accordance with the present invention by interfacing the Chirp-Z and the superheterodyne analyzers to synchronize the outputs therefrom for the hiqh resolution detection of phase shifted frequency components in composite siqnals. This interface controls the frequency of a local oscillator in the superheterodyne analyzer, from the output of the Chirp-Z analyzer and thereby provides the coordination necessary between the analyzers. In the parallel embodiments, the signal is applied simultaneously to the inputs of both analyzers, but is applied to only the Chirp-Z analyzer input in the series embodiments. The output from the Chirp-Z analyzer is applied to the input of the superheterodyne analyzer in the series embodiments, wherein delay circuitry for replicating that output may be utilized to sustain the integrity of the phase shifted frequency components for some predetermined period of time.

The scope of the present invention is only limited by the appended claims for which support is predicated on the preferred embodiments hereinafter set forth in the following description and the attached drawings.

DESCRIPTION OF THE PREFERRED EMBODIMENTS

Figure 1:
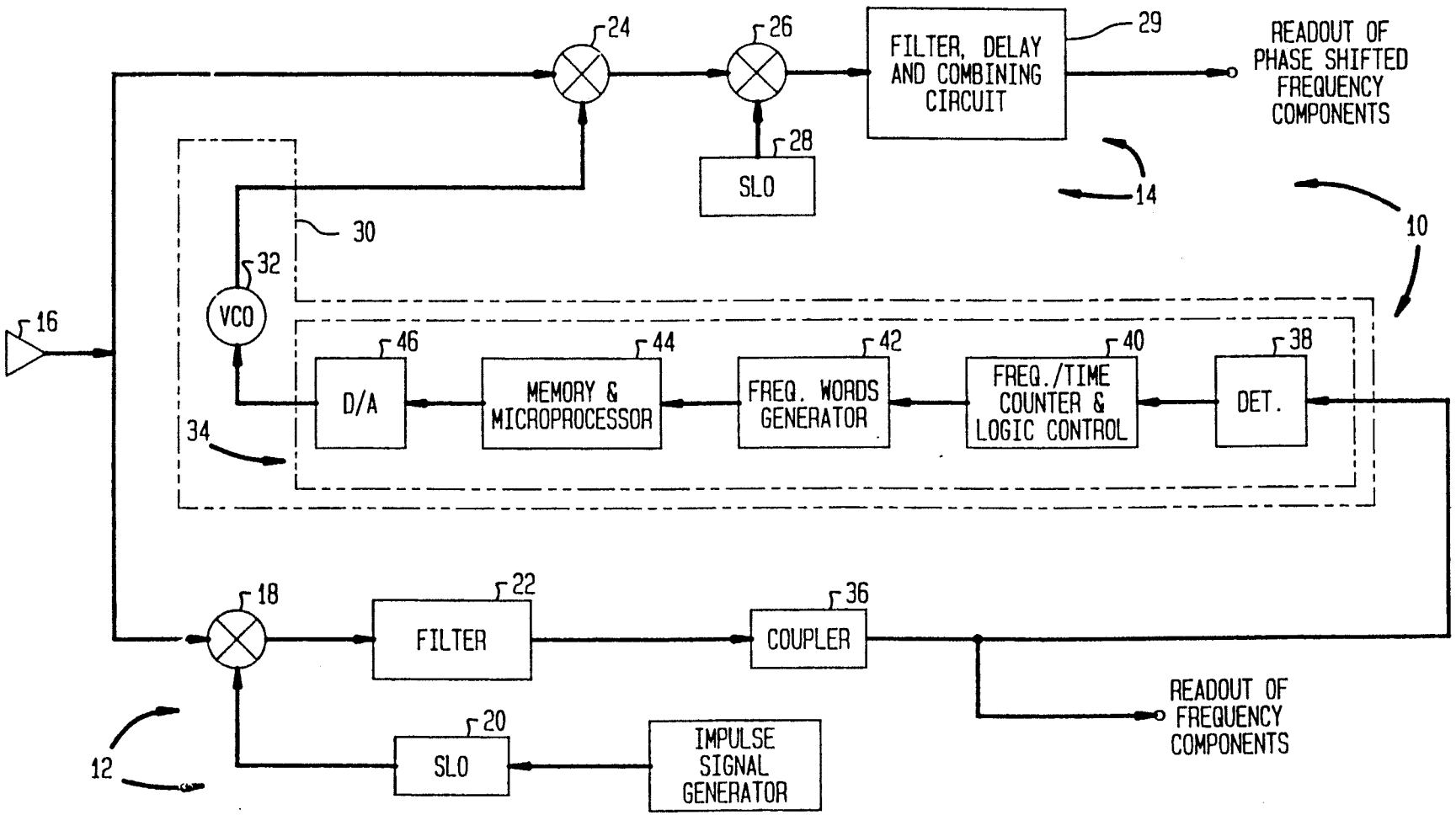
FIG. 1 is a block diagram illustration for preferred embodiments of this invention wherein the composite signal of phase shifted frequency components is applied to the inputs of both the Chirp-Z and superheterodyne analyzers which are generally arranged in parallel.
Figure 2:
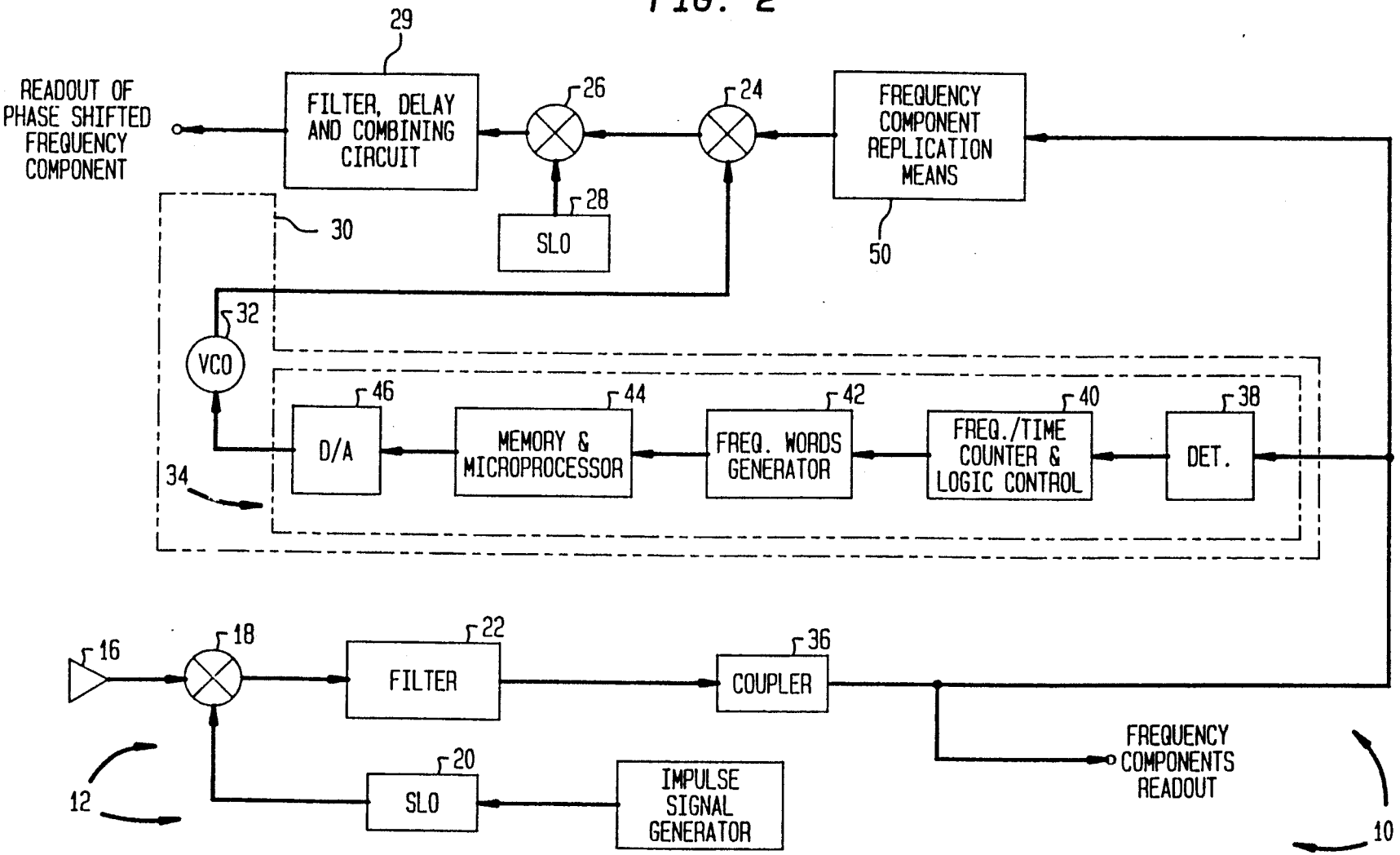
FIG. 2 is a block diagram illustration for preferred embodiments of this invention wherein the Chirp-Z and superheterodyne analyzers are generally arranged in series, with the composite signal of phase shifted frequency components applied only to the former.

The invention of this application relates to circuitry 10 wherein a conventional wide bandwidth Chirp-Z signal analyzer 12 is interfaced with a conventional narrow bandwidth, swept-tuned superheterodyne signal analyzer 14 to synchronize the outputs therefrom for the detection of the phase shifted frequency components in wide bandwidth composite signals, with high resolution. As shown in FIGS. 1 and 2 respectively, embodiments of the invention are possible wherein the analyzers 12 and 14 are generally arranged in either parallel or series. Chirp-Z analyzers have been well known, at least since R. M. Hays et al. presented SURFACE WAVE TRANSFORM ADAPTABLE PROCESSOR SYSTEM, pages 363–370 of the 1975 Ultrasonics Symposium Proceedings, IEEE Catalogue No. 75 CHO 994-4SU which is incorporated by reference herein. Such analyzers operate over some predetermined bandwidth to output a signal's frequency components in a frequency segregated time domain, however because state of the art filters for utilization therein have limited dispersion characteristics, the resolution of that output is also limited. Having been utilized in radar and communications receivers for many years, superheterodyne analyzers are also very well known in the art. Such analyzers can be swept-tuned to an operating frequency for very high resolution detection.

An antenna 16 directs a composite signal with many frequency components to the input of each analyzer 12 and 14 in the FIG. 1 embodiments, but only to the input of analyzer 12 in the FIG. 2 embodiments. Each of the analyzers 12 and 14 is identically structured for either the FIG. 1 or FIG. 2 embodiments.The Chirp-Z analyzer 12 includes a mixer 18 which beats the composite signal with the output from a sweeping local oscillator (hereinafter SLO) 20. The output frequency of the SLO 20 focuses the output from mixer 18 within the bandwidth of a compression filter 22 which is connected to receive that output and has the frequency characteristic thereof predetermined to derive a frequency segregated time domain output therefrom for the frequency components of the composite signal. Much of the circuitry discussed in regard to superheterodyne receivers between pages 9-57 and 9-67 in the published report entitled ELECTRONIC COUNTERMEASURES prepared by the Institute of Science and Technology of the University of Michigan for the U.S. Army Signal Corps under Contract DA-36-039 SC-71204, and edited by J. A. Boyd, D. B. Harris, D. D. King and H. W. Welch, Jr., is found in the superheterodyne analyzer 14. A tuning mixer 24 is included in analyzer 14 to beat the signal passing therethrough with a predetermined frequency and thereby focus the output therefrom on the frequency components in that signal. Output from mixer 24 is directed to another mixer 26 which beats the signal passing therethrough with the output from a SLO 28. The frequency of SLO 28 continually changes to further focus output from mixer 24 on the individual phase shifted frequency components of that signal, in accordance with the time domain output of the Chirp-Z analyzer 12. Output from mixer 26 is directed through a filter, delay and combining circuit 29 in accordance with FIGS. 9–24 of the above mentioned published report and thereby provides for the phase shifted frequency components to be individually outputted from the superheterodyne analyzer 14 with high resolution.

The embodiments of both FIGS. 1 and 2 also include interface means 30 between the analyzers 12 and 14 for synchronizing the presence or appearance of the phase shifted frequency components at the outputs of those analyzers 12 and 14. In the preferred embodiments of either FIG. 1 or FIG. 2, the interface means 30 includes a voltage controlled oscillator (hereinafter VCO) 32 that has the voltage at its input controlled from the output of the Chirp-Z analyzer 12. VCO 32 has its frequency output applied to control the mixer 24 which functions to rough tune the superheterodyne analyzer 14. In either FIG. 1 or FIG. 2, the VCO 32 is controlled to have an output frequency substantially equal to the difference between the frequency of the individual phase shifted frequency components and the center frequency of the filter, delay and combining circuit 29.

Means 34 is included in the embodiments of both FIGS. 1 and 2 for controlling the voltage input to the VCO 32 in accordance with the frequency difference between the individual phase shifted frequency components and the center frequency of the filter, delay and combining circuit 29. Of course, all phase shifted frequency components in the composite signal appear periodically in the frequency segregated time domain output of the Chirp-Z analyzer 12. In accordance with well known techniques, these frequency components are applied through a coupler 36 to derive a "frequency word" or digital code for each such frequency component received by the voltage control means 34. A video detector 38 receives the frequency components and derives frequency related pulses therefrom which are applied to a frequency/time counter and logic control unit 40 to derive identifying information for the frequency components using the known principle that the frequency of each component is proportional to that component's relative position in the frequency segregated time domain of the Chirp-Z analyzer 12. Although unit 40 could include a single counter in limited applications of the invention, it would include a plurality of parallel counters in most applications thereof. Such identifying information is applied to a frequency word generator 42 which outputs a digital code for each frequency component identified. In one preferred embodiment, a memory and microprocessor unit 44 receives these digital codes and controls a D/A convertor 46 to derive an input voltage level for the VCO 32 at which the output frequency therefrom is substantially equal to the frequency difference between the individual phase shifted frequency components and the center frequency range of the filter, delay and combining circuit 29. The memory and microprocessor unit 44 also provides the buffer storage necessary to individually process the frequency words relating to all of the phase shifted frequency components, in accordance with the frequency segregated time domain output of the Chirp-Z analyzer 12.

Figure 3:
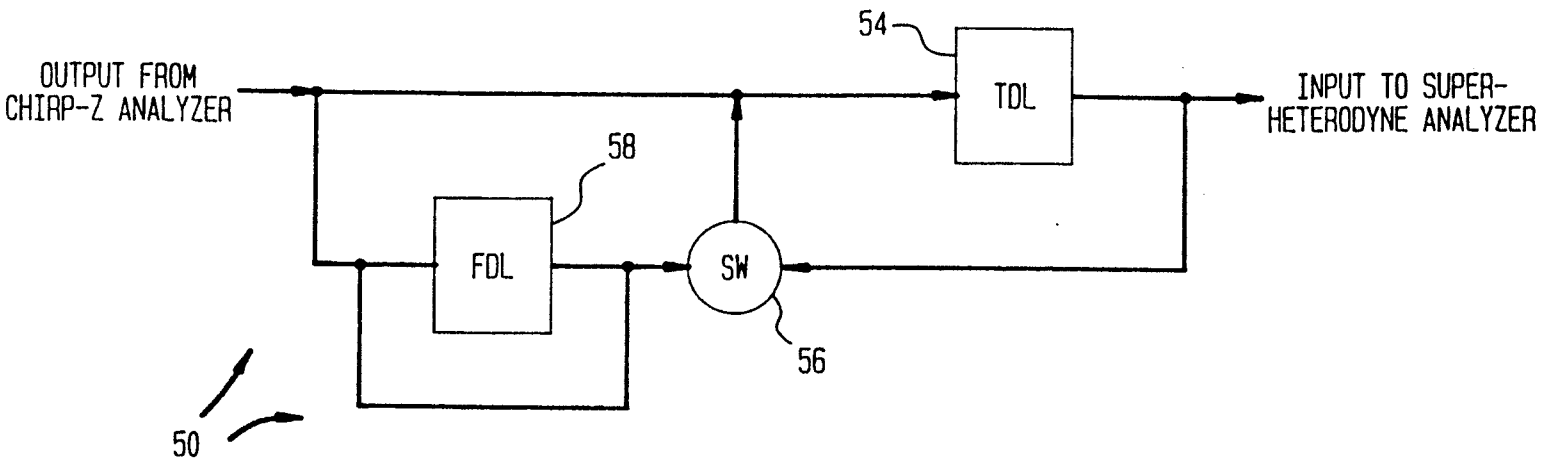
FIG. 3 is a block diagram illustration of circuitry for replicating signals to sustain the integrity thereof over some period of time.

Because the superheterodyne analyzer 14 receives its input from the output of the Chirp-Z analyzer 12 in the FIG. 2 embodiments, means 50 for replicating the phase shifted frequency components is incorporated into one preferred embodiment for sustaining the integrity of each such frequency component over some predetermined period of time. Although other implementations of the replicating means 50 are possible, the published presentation of SAW TAPPED DELAY LINES FOR NEW POTENTIAL CIRCUIT APPLICATIONS by the inventor at the Proceedings Of The 42ND Annual Symposium On Frequency Control 1988 (IEEE Catalog No. 88CH2588-2 and Library of Congress No. 58-60781), discloses one such implementation and the operation thereof. For this implementation, the phase shifted frequency components from the frequency segreqated time domain output of the Chirp-Z analyzer 12 are applied to the input of the superheterodyne analyzer 14 through a tapped delay line 54, as shown in Figure 3. Feedback through a switch 56 is utilized between the output and input of TDL 54. Switch 56 is controlled through a fixed delay line 58, with the output of the Chirp-Z analyzer 12. By cycling switch 56 on for each output of a phase shifted frequency component from TDL 54, that component is replicated continuously for the on time of the switch 56. Due to replication, phase shifted frequency components of very short duration can be detected with high resolution and therefore, the sensitivity of detection is enhanced.

Those skilled in the art will appreciate without any further explanation that many modifications and variations are possible to the above disclosed embodiments of signal analyzer circuitry within the concept of this invention. Consequently, it should be understood that all such modifications and variations fall within the scope of the following claims.

What I claim is:

1. Circuitry for analyzing the phase shifted frequency components of composite signals, comprising:

a wide bandwidth Chirp-Z signal analyzer for deriving segregated time domain outputs of the phase shifted frequency components;

a swept-tuned, narrow bandwidth superheterodyne signal analyzer for outputting the phase shifted frequency components with high resolution; and interface means between said Chirp-Z and superheterodyne analyzers for sychronizing the presence of the phase shifted frequency components at the outputs of those analyzers.

2. The circuitry of claim 1 wherein said interface means includes a voltage controlled oscillator having its output applied to rough tune said superheterodyne analyzer.

3. The circuitry of claim 2 wherein said interface means further includes means for controlling the voltage input to said voltage controlled oscillator in accordance with the relative position occupied by the phase shifted frequency components in the frequency seqregated time domain output of said Chirp-Z analyzer.

4. The circuitry of claim 3 wherein said voltaqe control means further includes;

a video detector having the phase shifted frequency components in the frequency segregated time domain output of said Chirp-Z analyzer applied thereto and deriving unique pulse counts therefrom for each phase shifted frequency component represented in said Chirp-Z analyzer output;

a frequency/time counter and logic control unit having the unique pulse counts from said video detector applied thereto and deriving information therefrom to identify each phase shifted frequency component in accordance with the relative position occupied thereby in the frequency segregated time domain of said Chirp-Z analyzer;

a frequency word generator having the identifying information from said frequency/time counter and logic control unit applied thereto and deriving a digital code therefrom for each phase shifted frequency component;

a memory and microprocessor unit having the digital codes from said frequency word generator applied thereto and deriving a digital representation therefrom for a voltage in accordance with the frequency difference between the selected frequency component and the frequency output of said voltage controlled oscillator; and a digital-to-analog converter having the digital representation from said memory and microprocessor unit applied thereto and directing the equivalent analog voltage therefor to said voltage controlled oscillator.

5. The circuitry of claim 1 wherein said Chirp-Z and superheterodyne analyzers are arranged in parallel.

6. The circuitry of claim 5 wherein said interface means includes a voltage controlled oscillator having its output applied to a mixer within said superheterodyne analyzer for tuning that analyzer.

7. The circuitry of claim 6 wherein the superheterodyne analyzer output passes from a filter, delay and combining circuit and the voltage of said oscillator is controlled in accordance with the frequency difference between the individual phase shifted frequency components and the center frequency of that circuit.

8. The circuitry of claim 1 wherein said Chirp-Z and superheterodyne analyzers are arranged in series.

9. The circuitry of claim 8 wherein said interface means includes a voltage controlled oscillator having its output applied to a mixer within said superheterodyne analyzer for tuning that analyzer.

10. The circuitry of claim 9 wherein the superheterodyne analyzer output passes from a filter, delay and combining circuit and the voltage of said oscillator is controlled in accordance with the frequency difference between the individual phase shifted frequency components and the center freqüency of that circuit.

11. The circuitry of claim 8 wherein output from said Chirp-Z analyzer is directed to the input of said superheterodyne analyzer through a means for replicating the phase shifted frequency components to sustain the integrity thereof over some predetermined period of time.

12. The circuitry of claim 11 wherein said replicating means directs output from said Chirp-Z analyzer to the input of said superheterodyne analyzer through a tapped delay line having feedback from its output through a switch to its input, while said switch is controlled through a fixed delay line with output from said Chirp-Z analyzer.

13. Circuitry for analyzing the phase shifted frequency components of composite signals, comprising:

a single antenna for receiving the composite signals;

a swept-tuned, narrow bandwidth superheterodyne signal analyzer for outputting the phase shifted frequency components with high resolution;

a wide bandwidth Chirp-Z signal analyzer for deriving segregated time domain outputs of the phase shifted frequency components, said Chirp-Z signal analyzer being series connected between said antenna and said superheterodyne analyzer; and interface means between said Chirp-Z and superheterodyne analyzers for synchronizing the presence of the phase shifted frequency components at the outputs of those analyzers.

14. The circuitry of claim 13 wherein said interface means includes a voltage controlled oscillator having its output applied to rough tune said superheterodyne analyzer.

15. The circuitry of claim 14 wherein said interface means further includes means for controlling the voltage input to said voltage controlled oscillator in accordance with the relative position occupied by the phase shifted frequency components in the frequency segregated time domain output of said Chirp-Z analyzer.

16. The circuitry of claim 15 wherein said voltage control means further includes;

a video detector having the phase shifted frequency components in the frequency segregated time domain output of said Chirp-Z analyzer applied thereto and deriving unique pulse counts therefrom for each phase shifted frequency component represented in said Chirp-Z analyzer output;

a frequency/time counter and logic control unit having the unique pulse counts from said video detector applied thereto and deriving information therefrom to identify each phase shifted frequency component in accordance with the relative position occupied thereby in the frequency segregated time domain of said Chirp-Z analyzer;

a frequency word generator having the identifying information from said frequency/time counter and logic control unit applied thereto and deriving a digital code therefrom for each phase shifted frequency component;

a memory and microprocessor unit having the digital codes from said frequency word generator applied thereto and deriving a digital representation therefrom for a voltage in accordance with the frequency difference between the selected frequency component and the frequency output of said voltage controlled oscillator; and a digital-to-analog converter having the digital representation from said memory and microprocessor unit applied thereto and directing the equivalent analog voltage therefor to said voltage controlled oscillator.

17. The circuitry of claim 13 wherein said interface means includes a voltage controlled oscillator having its output applied to a mixer within said superheterodyne analyzer for tuning that analyzer.

18. The circuitry of claim 17 wherein said superheterodyne analyzer output passes from a filter, delay and combining circuit and the voltage of said oscillator is controlled in accordance with the frequency difference between the individual phase shifted frequency components and the center frequency of that circuit.

19. The circuitry of claim 13 wherein output from said Chirp-Z analyzer is directed to the output of said superheterodyne analyzer through a means for replicating the phase shfted frequency components to sustain the integrity thereof over some predetermined period of time.

20. The circuitry of claim 19 wherein said replicating means direct output from said Chirp-Z analyzer to the input of said superheterodyne analyzer through a tapped delay line having feedback from its output through a switch to its input, while said switch is controlled through a fixed delay line with output from said Chirp-Z analyzer.

* * * * *